(12) United States Patent
Shin et al.

(10) Patent No.: US 10,968,098 B2
(45) Date of Patent: Apr. 6, 2021

(54) SELECTIVE FUNCTIONALIZATION OF SENSING SURFACE WITH NANOSCALE SPATIAL RESOLUTION

(71) Applicant: International Business Machines Corporation, Armonk, NY (US)

(72) Inventors: SangHoon Shin, Folsom, CA (US); Sufi Zafar, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 73 days.

(21) Appl. No.: 16/149,813

(22) Filed: Oct. 2, 2018

(65) Prior Publication Data
US 2020/0102218 A1 Apr. 2, 2020

(51) Int. Cl.
*B81C 1/00* (2006.01)
*G01N 27/414* (2006.01)

(52) U.S. Cl.
CPC ..... *B81C 1/00206* (2013.01); *G01N 27/4145* (2013.01); *G01N 27/4146* (2013.01)

(58) Field of Classification Search
None
See application file for complete search history.

(56) References Cited

U.S. PATENT DOCUMENTS

| | | | |
|---|---|---|---|
| 8,314,357 B2 | 11/2012 | Kuypers | |
| 8,389,325 B2 | 3/2013 | Carella et al. | |
| 9,645,135 B2 | 5/2017 | Shin et al. | |
| 9,821,321 B2 | 11/2017 | Fischer | |
| 2004/0195563 A1* | 10/2004 | Bao | G01N 27/4145 257/40 |
| 2010/0216256 A1 | 8/2010 | Cheng et al. | |
| 2010/0260745 A1* | 10/2010 | Zhou | A61P 35/00 424/130.1 |

(Continued)

FOREIGN PATENT DOCUMENTS

WO    2004034025 A2    4/2004

OTHER PUBLICATIONS

Elibol, Oguz et al., "Localized heating and thermal characterization of high electrical resistivity silicon-on-insulator sensors using nematic liquid crystals", Applied Physics Letters 93, 131908 (2008) (Year: 2008).*

(Continued)

*Primary Examiner* — Erik Kielin
(74) *Attorney, Agent, or Firm* — Cantor Colburn LLP; Anthony Curro

(57) ABSTRACT

A nanoscale selective functionalization method is provided. The nanoscale functionalization method includes self-assembling first molecules to nanowires of transistors provided on a wafer. The nanoscale functionalization method further includes identifying a transistor as a target transistor and transistors neighboring the target transistor as neighboring transistors. In addition, the nanoscale functionalization method includes disassembling the first molecules from the nanowire of the target transistor without disassembling the first molecule from the nanowires of the neighboring transistors. The nanoscale functionalization method also includes self-assembling second molecules to the nanowire of the target transistor.

12 Claims, 5 Drawing Sheets

(56) References Cited

U.S. PATENT DOCUMENTS

2013/0225416 A1     8/2013    Altmann et al.
2014/0054651 A1     2/2014    Bashir et al.

OTHER PUBLICATIONS

"Protein structure: Primary, secondary, tertiary & quaternary" available at URL: https://www.khanacademy.org/science/biology/macromolecules/proteins-and-amino-acids/a/orders-of-protein-structure (Year: 2020).*

Elibol et al., "Localized Heating on Silicon Field Effect Transistors: Device Fabrication and Temperature Measurements in Fluid", Lab Chip. Oct. 7, 2009; 9(19),pp. 2789-2795.

Jin et al., "Using nanoscale thermocapillary flows to create arrays of purely semiconducting single-walled carbon nanotubes", Articles, Published Online: Apr. 28, 2013, vol. 8, pp. 347-355.

Mu et al., "Silicon Nanowire Field-Effect Transistors—A Versatile Class of Potentiometric Nanobiosensors", IEEE Access, vol. 3, 2015, pp. 287-302.

Park et al., "Selective Surface Functionalization of Silicon Nanowires via Nanoscale Joule Heating", Nano Letters, 2007, vol. 7, No. 10, pp. 3106-3111.

Reddy Jr. et al., "Silicon Field Effect Transistors as Dual-Use Sensor-Heater Hybrids", Anal Chem. Feb. 1, 2011; 83(3), pp. 888-895.

List of IBM Patents or Patent Applications Treated as Related; (Appendix P), Filed Oct. 2, 2018; 2 pages.

* cited by examiner

SELECTIVE FUNCTIONALIZATION OF SENSING SURFACE WITH NANOSCALE SPATIAL RESOLUTION

BACKGROUND

The present invention generally relates to nanoscale sensors. More specifically, the present invention relates to selective functionalization of a sensing surface with nanoscale spatial resolution.

Nano-scale sensors or nanosensors are sensors whose active elements are characterized in that they are of nanometer length scale. Nanosensors can be made in several ways including, but not limited to, top-down lithography, bottom-up assembly and molecular self-assembly.

Nanosensors have several benefits in sensitivity and specificity over sensors made from traditional materials. Nanosensors can have increased sensitivity and resolution because they operate at a similar scale as natural biological processes, allowing functionalization with chemical and biological molecules through recognition events that cause detectable physical changes. Enhancements in sensitivity stem from high surface-to-volume ratio of nanomaterials, as well as novel physical properties of nanomaterials that can be used as the basis for detection, including nanophotonics. Nanosensors can also potentially be integrated with nanoelectronics to add native processing capability.

For example, one-dimensional nanomaterials such as nanowires and nanotubes are often well suited for use in nanosensors, as compared to bulk or thin-film planar devices. These materials can function both as transducers and wires to transmit signals and their relatively high surface area can cause large signal changes upon the binding of an analyte while their relatively small size can enable extensive multiplexing of individually addressable sensor units in a small device.

SUMMARY

Embodiments of the present invention are directed to a nanoscale selective functionalization method. A non-limiting example of the method includes self-assembling first molecules to nanowires of transistors provided on a wafer. The non-limiting example of the method further includes identifying a transistor as a target transistor and transistors neighboring the target transistor as neighboring transistors. In addition, the non-limiting example of the method includes disassembling the first molecules from the nanowire of the target transistor without disassembling the first molecule from the nanowires of the neighboring transistors. The non-limiting example of the method also includes self-assembling second molecules to the nanowire of the target transistor.

Embodiments of the present invention are directed to a nanoscale selective functionalization method. A non-limiting example of the method includes assembling a wafer that includes transistors with each transistor including a nanowire extending between a source and a drain. The non-limiting example of the method further includes immersing the wafer in a first solution in which a first molecule, which binds to a material of the nanowires, is dissolved until self-assembly of the first molecule onto the nanowires is complete. The non-limiting example of the method also includes identifying a transistor as a target transistor and transistors neighboring the target transistor as neighboring transistors. In addition, the non-limiting example of the method includes heating the target transistor to disassemble the first molecule from the corresponding nanowire without disassembling the first molecule from the nanowires of the neighboring transistor. Following the disassembly, the non-limiting example of the method includes re-immersing the wafer in a second solution in which a second molecule, which binds to a material of the nanowires, is dissolved until self-assembly of the second molecule onto the nanowire of the target transistor is complete.

Embodiments of the invention are directed to a selectively functionalized nanosensor. A non-limiting example of the selectively functionalized nanosensor includes a substrate and transistors (FETs) arrayed on the substrate. Each transistor includes a nanowire extending between a source and a drain. One of the transistors is identifiable as a target transistor and transistors neighboring the target transistors are identifiable as neighboring transistors. The non-limiting example of the selectively functionalized nanosensor further includes first molecules self-assembled to the nanowires of the neighboring transistors and second molecules self-assembled to the nanowire of the target transistor.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
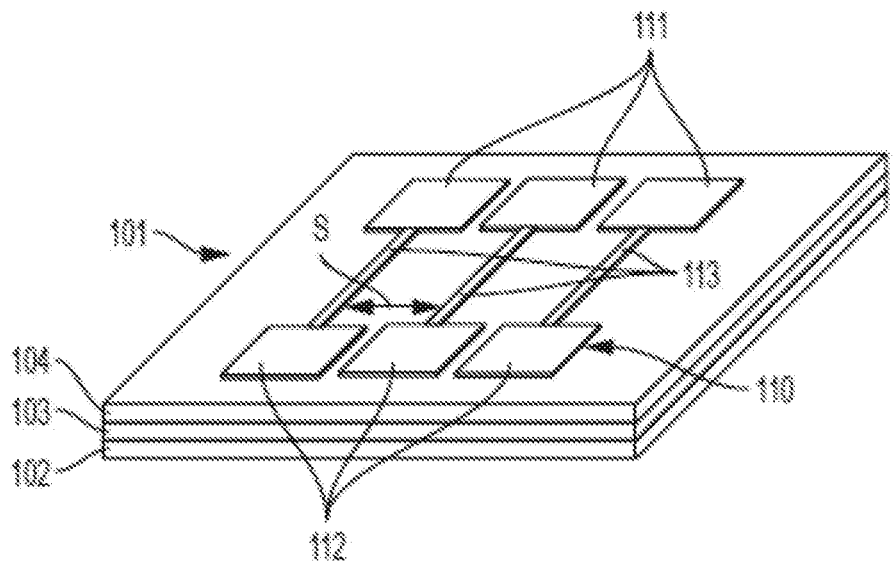
FIG. 1 is a perspective view of a wafer having FETs formed thereon in accordance with embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device, integrated circuit (IC) and nanosensor fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices, semiconductor-based ICs and nanosensors are well known and so, in the interest of brevity, many conventional steps will only be mentioned briefly herein or will be omitted entirely without providing the well-known process details.

Turning now to an overview of technologies that are more specifically relevant to aspects of the invention, analyte detection systems often have to be able to detect several analytes (proteins, ions, viruses etc.) for a small volume. This small volume could be nanometer scale. Therefore, detection systems need to include sensors whose smallest spatial resolution for functionalization is similarly on the nanometer scale. Currently, however, the smallest spatial resolution for sensor functionalization is around 1 micron.

Turning now to an overview of the aspects of the invention, one or more embodiments of the invention address the above-described shortcomings of the prior art by providing for a nanoscale selective functionalization method. A non-limiting example of the method includes self-assembling first molecules to nanowires of transistors provided on a wafer. The non-limiting example of the method further includes identifying a transistor as a target transistor and transistors neighboring the target transistor as neighboring transistors. In addition, the non-limiting example of the method includes disassembling the first molecules from the nanowire of the target transistor without disassembling the first molecule from the nanowires of the neighboring transistors. The non-limiting example of the method also includes self-assembling second molecules to the nanowire of the target transistor.

The above-described aspects of the invention address the shortcomings of the prior art in that they present a method for functionalization at nanoscale resolution. In particular, specific field effect transistor (FET) structures are proposed in which drain current heating is sufficient to selectively remove self-assembled molecules and thus achieve selective functionalization. The resulting nanosensors can have differently functionalized sensing surfaces and thus enable the detection of multiple analytes from a small sample volume. In some cases, the nanosensors can be provided as quasi-one dimensional nanowire FET sensors which have a unique ability to detect analytes at low concentrations and can also be fabricated in close packed arrays.

Turning now to a more detailed description of aspects of the present invention, FIG. 1, is an illustration of wafer 101 that is assembled according to embodiments of the present invention. The wafer 101 can include a substrate 102, such as a silicon substrate, a buried oxide (BOX) layer 103 and a semiconductor layer 104 in a silicon-on-insulator (SOI) configuration. As shown in FIG. 1, the wafer 101 further includes transistors, such as field effect transistors (FETs) 110 that are arrayed on the semiconductor layer 104. The FETs 110 each include a source 111, a drain 112 and a nanowire 113 extending between the source 111 and the drain 112. The FETs 110 may be arranged in a side-by-side nanoscale formation 120 in which the sources 111 are generally aligned with each other, the drains 112 are generally aligned with each other and the nanowires 113 are generally aligned with each other.

Each source 111, each drain 112 and each nanowire 113 can include a semiconductor material, such as silicon or another similar material. The following description will relate to the case in which at least the nanowires 113 are formed of silicon. This is done for clarity and brevity and is not intended to otherwise limit the scope of the application.

Figures 2, 3:
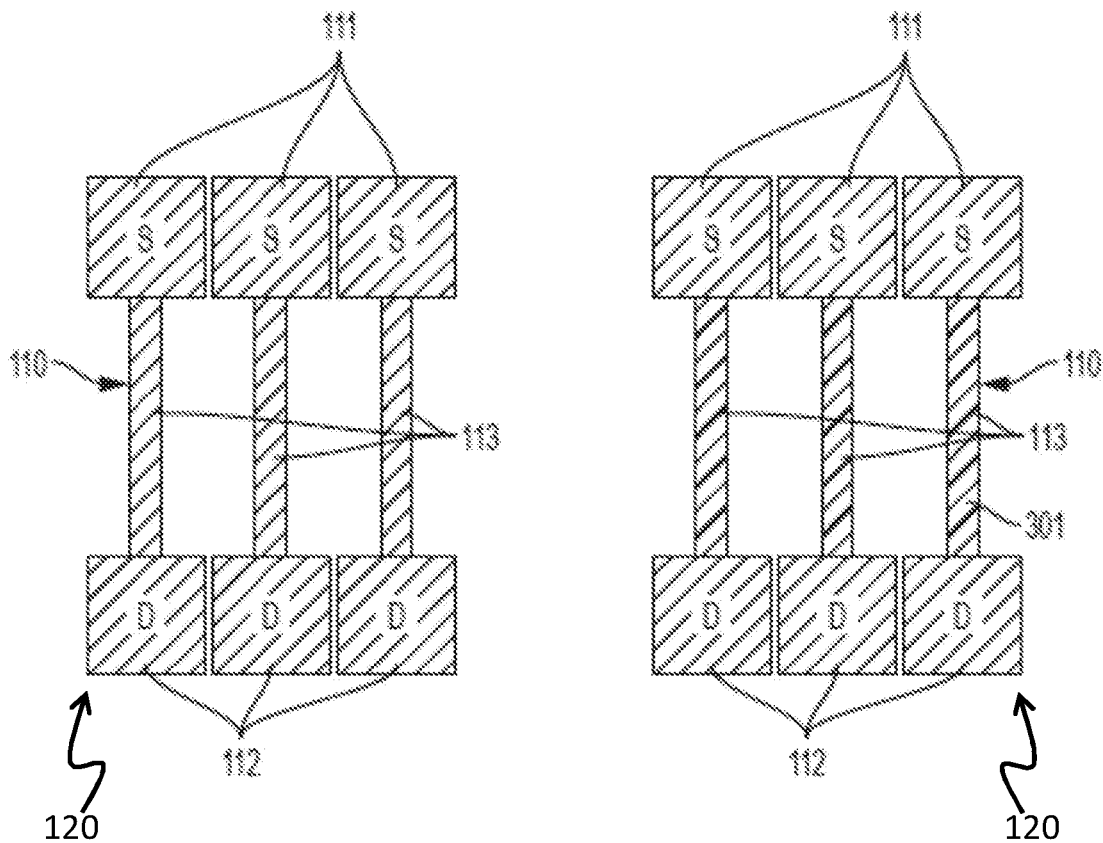
FIG. 2 is a top down view of FETs prior to a self-assembly process being executed in accordance with embodiments of the present invention.
FIG. 3 is a top down view of FETs following a self-assembly process being executed in accordance with embodiments of the present invention.

The FETs 110 are illustrated schematically in FIG. 2.

Once the wafer 101 is assembled, the wafer 101 is immersed in a first solution. The first solution may include a water- or alcohol-based solvent and a first molecule 301 that is dissolved in the solvent. The first molecule 301 has an affinity towards binding with the silicon of the nanowires 113 of the FETs 110 of the wafer 101. The wafer 101 remains immersed in the solvent until self-assembly of the first molecule 301 onto the nanowires 113 is complete.

The FETs 110 with the first molecule 301 self-assembled onto the nanowires 113 are illustrated schematically in FIG. 3.

Figure 4:
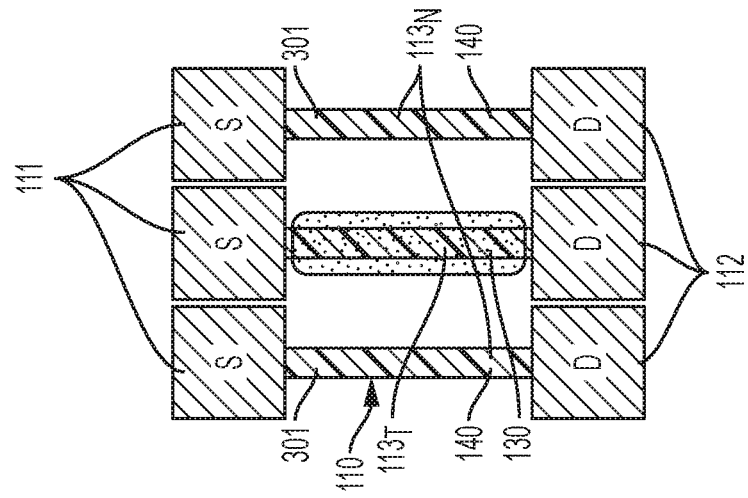
FIG. 4 is a top down view of the FETs of FIG. 3 with a target FET being heated in accordance with embodiments of the present invention.

With continued reference to FIG. 3 and with additional reference to FIG. 4, one or more of the FETs 110 is identified as a target transistor or target FET 130 and FETs 110 that neighbor the target FET 130 are identified as neighboring transistors or neighboring FETs 140. At this point, as shown in FIG. 4, the target FET 130 is heated to a temperature as which the first molecule 301 desorbs or disassembles from the corresponding nanowire $113_T$. The heating can be executed by an application of drain current to the target FET 130 and raises the temperature of only the target FET 130 to the minimum temperature at which the first molecule 301 disassembles from the nanowire $113_T$. Thus, the heating of the target FET 130 does not heat the neighboring FETs 140 to the minimum temperature for disassembly and does not result in the disassembly of the first molecule 301 from the nanowires $113_N$ of the neighboring FETs 140.

Figure 5:
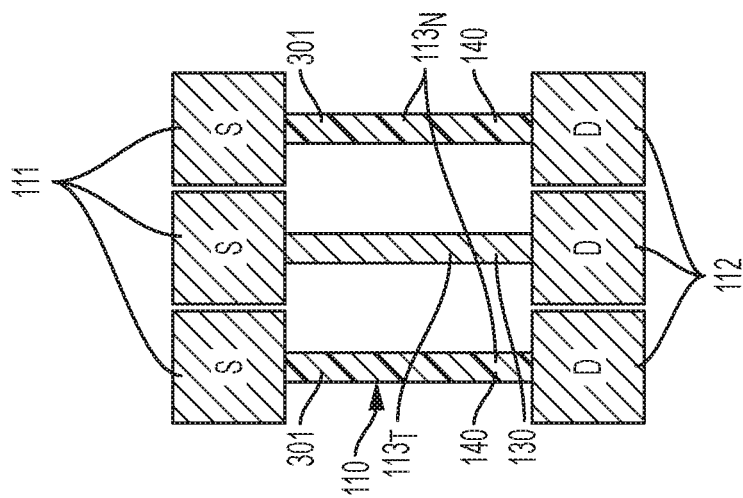
FIG. 5 is a top down view of the FETs of FIG. 4 with the target FET having been heated to a disassembly temperature in accordance with embodiments of the present invention.

The target FET 130 following disassembly of the first molecule 301 from the nanowire $113_T$ and the neighboring FETs 140 at which disassembly of the first molecule 301 from the nanowires 113$_N$ has not occurred are illustrated schematically in FIG. 5.

Following the disassembly of the first molecule 301 from the nanowire 113$_T$ of the target FET 130, the wafer 101 is re-immersed in a second solution. The second solution may include a water- or alcohol-based solvent and a second molecule 601 that is dissolved in the solvent. The second molecule 601 has an affinity towards binding with the silicon of the nanowire 113$_T$ of the target FET 130. The wafer 101 remains immersed in the solvent until self-assembly of the second molecule 601 onto the nanowire 113$_T$ of the target FET 130 is complete.

Figure 6:
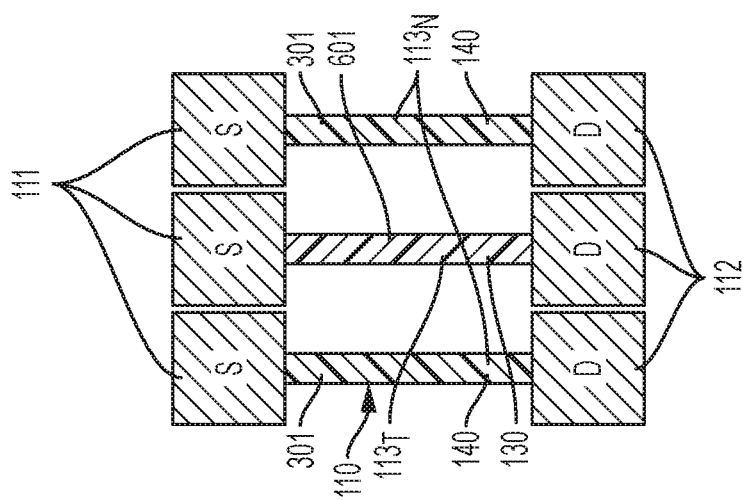
FIG. 6 is a top down view of the FETs of FIG. 5 following a self-assembly process being executed with respect to the target FET in accordance with embodiments of the present invention.

The target FET 130 following the self-assembly of the second molecule 601 to the nanowire 113$_T$ and the neighboring FETs 140 at which disassembly of the first molecule 301 has not occurred are illustrated schematically in FIG. 6.

In accordance with embodiments of the present invention, the first and second molecules 301, 601 can include proteins, viruses, ions, etc. As such, where the nanowire 113$_T$ of the target FET 130 has the second molecule 601 bound thereto while the nanowires 113$_N$ of the neighboring FETs 140 have the first molecule 301 bound thereto, the functionalization of the target FET 130 is effectively differentiated from the functionalization of the neighboring FETs 140.

Figure 7:
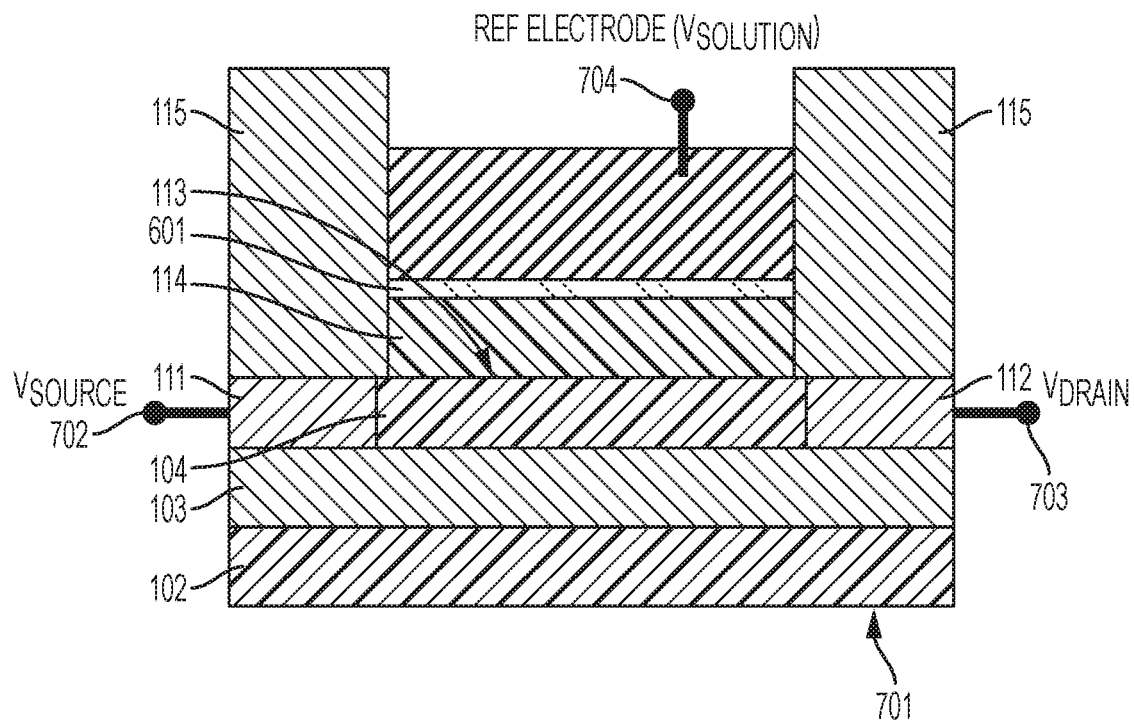
FIG. 7 is a schematic cross-sectional illustration of a nanowire FET sensors fabricated on an SOI wafer in accordance with embodiments of the present invention.

With reference to FIG. 7, a result of the self-assembly processes described above can be the provision of an FET sensor 701. The FET sensor 701 is effectively fabricated on an SOI wafer and includes the substrate 102, the BOX layer 103 and the semiconductor layer 104. Within the semiconductor layer 104, a nanowire 113 extends between a source 111 and a drain 112 to form the channel of the FET sensor 701. The nanowire 113 is covered with an insulating film 114. The insulating film 114 can be formed of silicon dioxide or a combination of silicon dioxide and hafnium dioxide, for example. The insulating film 114 extends between spacers 115 and is in contact with the second solution whereby the second molecule 601 self-assembles on the insulating film 114. Electrical current can be supplied through the FET sensor 701 by way of leads 702 (V$_{source}$) and 703 (V$_{drain}$) with reference current for sensing applied to lead 704 (V$_{solution}$).

Figure 8:
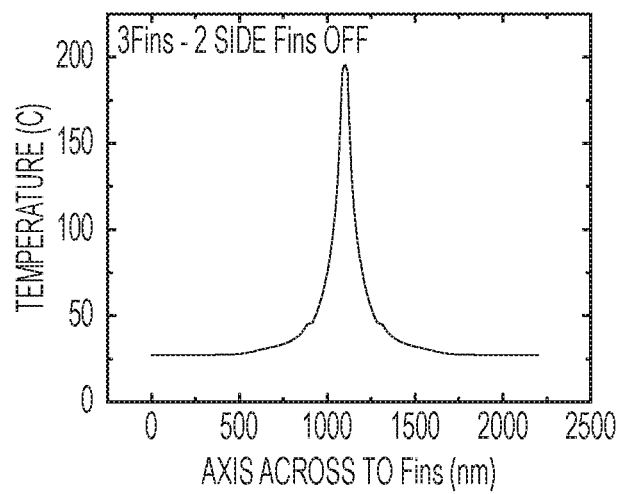
FIG. 8 is a graphical depiction of a temperature profile of a wafer during a disassembly heating process in accordance with embodiments of the present invention.

With reference to FIG. 8, the operation of heating the target FET 130 such that disassembly does not occur at the neighboring FETs 140 can be executed such that an increased temperature region is localized at the axis of the nanowire 113$_T$ of the target FET 130. As shown in FIG. 8, in an event the temperature at which disassembly of the first molecule 301 occurs is around 150° C., the neighboring FETs 140 should be placed around 150 nm from the target FET 130. At this distance, the neighboring FETs 140 will be slightly heated by the heating of the target FET 130 but the heating will be insufficient to raise the temperature of the neighboring FETs 140 to the disassembly temperature.

In accordance with embodiments of the present invention, the original assembly of the wafer 101 can take into account the disassembly temperature as well as the localization of the heating of the target FET 130 in order to determine a placement of the neighboring FETs 140 relative to the target FET 130. That is, the assembling of the wafer 101 includes providing spacing S (see FIG. 1) between the target FET 130 and the neighboring FETs 140. The spacing S is sufficient to prevent the heating of the target FET 130 from heating the neighboring FETs 140 to the disassembly temperature even if the heating heats the neighboring FETs 140 to a temperature that is otherwise safely below the disassembly temperature.

The original assembly of the wafer 101 can also take into account dimensions of the target FET 130 and the neighboring FETs 140 in order to avoid the induced disassembly of the first molecule 301 from the nanowires 113$_N$ of the neighboring FETs 140 and also to avoid degrading sensing characteristics of the resulting structures. As a general matter, optimized FET structures for a nanosensor exhibit enhanced sensing characteristics and the ability to withstand heating. The enhanced sensing characteristics can arise from relatively small surface areas of the target FET 130 and the neighboring FETs 140 and from an absence of short channel effects. On the other hand, the ability of the target FET 130 and the neighboring FETs 140 in particular to withstand heating can arise from these features having relatively large structures (e.g., a large fin height which promotes controlled heating but can prevent certain sensing capabilities).

Figure 9:
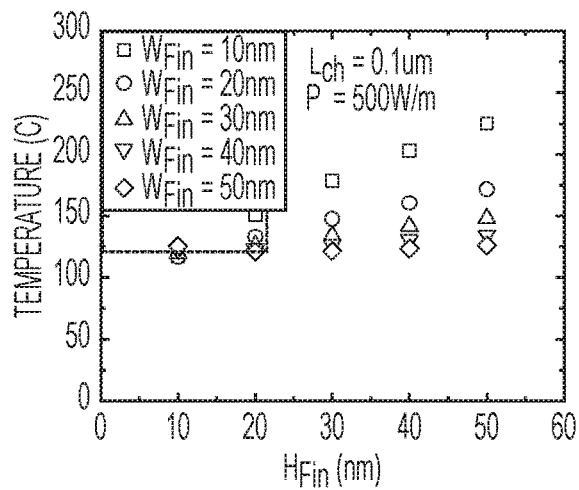
FIG. 9 is a graphical depiction of an optimization of fin height and width for various conditions in accordance with embodiments of the present invention.
Figure 10:
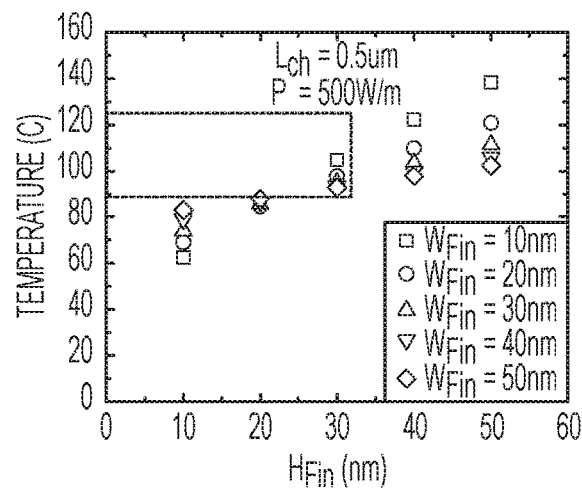
FIG. 10 is a graphical depiction of an optimization of fin height and width for various conditions in accordance with embodiments of the present invention.
Figure 11:
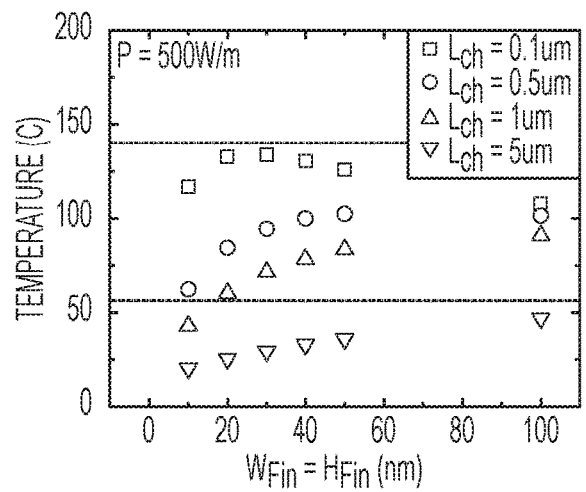
FIG. 11 is a graphical depiction of an optimization of fin height and width for various conditions in accordance with embodiments of the present invention.

With reference to FIGS. 9-11, graphical depictions of fin width and height optimizations are shown for various conditions. As shown in FIG. 9, if the disassembly temperature for disassembling the first molecule 301 from the nanowire 113T of the target FET 130 is about 150° C. and a channel length is about 0.1 μm, a height of the target FET 130 should be about 20 nm and a width of the target FET 130 should be about 20 nm. As shown in FIG. 10, if the disassembly temperature for disassembling the first molecule 301 from the nanowire 113T of the target FET 130 is about 100° C. and a channel length is about 0.5 μm, a height of the target FET 130 should be about 30 nm and a width of the target FET 130 should be about 30 nm. The graphics of FIG. 11 illustrate that optimized structures for various applications which are manufactural in existing fabrication lines, if the disassembly temperature for disassembling the first molecule 301 from the nanowire 113T of the target FET 130 is about 60-140° C. and a channel length is about 0.1-1 μm, a height of the target FET 130 should be about 20-40 nm and a width of the target FET 130 should be about 20-40 nm.

Figure 12:
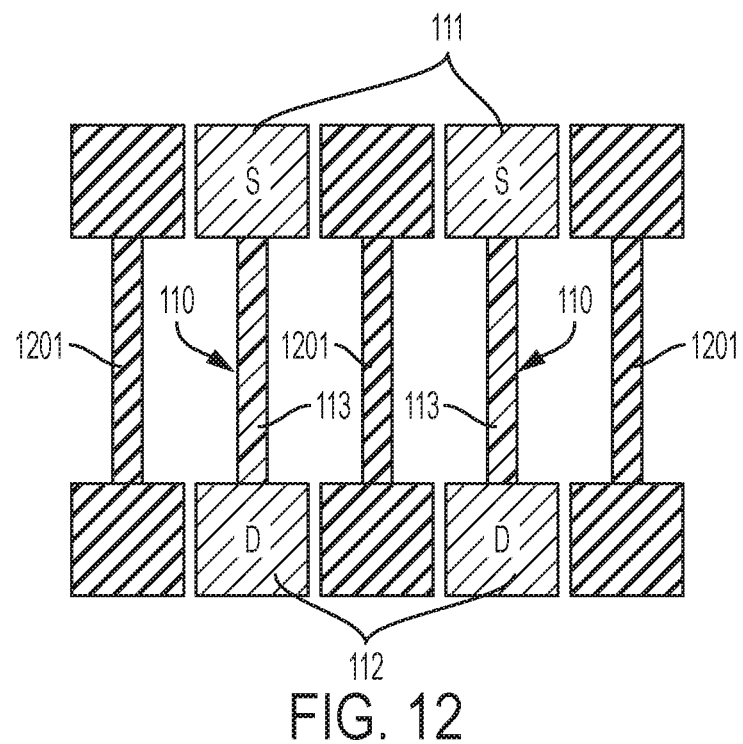
FIG. 12 is a top down view of FETs with shielding in accordance with embodiments of the present invention.

In accordance with further embodiments of the present invention and, with reference to FIG. 12, shielding 1201 can be provided between the FETs 110. The shielding 1201 can include tungsten (W) or another similar material and can be fashioned in an FET-type configuration that aligns with the sources 111, the drains 112 and the nanowires 113 of the FETs 110. In any case, the shielding 1201 can prevent the heating of the target FET 130 from heating the neighboring FETs 140 and can thus allow the neighboring FETs 140 to be placed closer to the target FET 130 (i.e., from a spacing of 150 nm to 50 nm).

Figure 13:
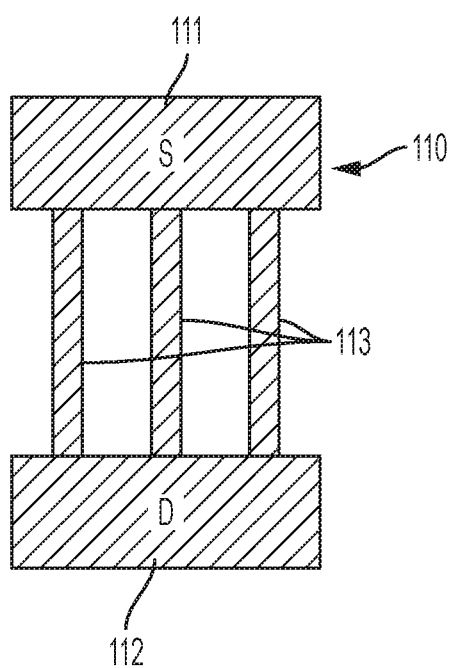
FIG. 13 is a top down view of FETs with multiple nanowires in accordance with embodiments of the present invention.
Figure 14:
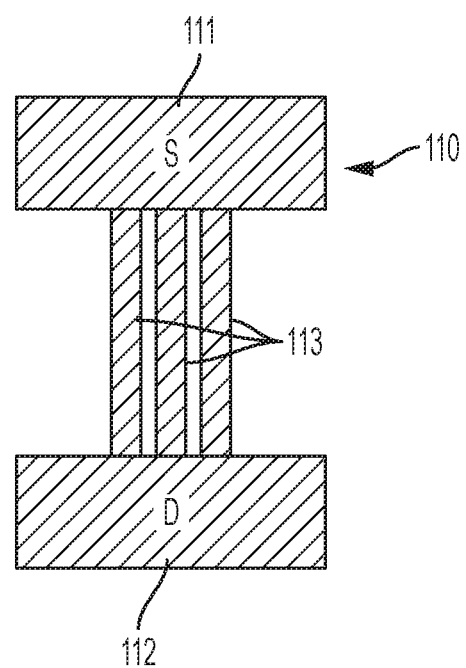
FIG. 14 is a top down view of FETs with multiple nanowires in accordance with embodiments of the present invention.

With reference to FIGS. 13 and 14, each FET 110 may include multiple nanowires 113 extending between the source 111 and the drain 112. As shown in FIGS. 13 and 14, the assembling can be executed such that a pitch between the multiple nanowires 113 is variable between a relatively wide pitch (see FIG. 13) and a relatively narrow pitch (see FIG. 14). In either case, the varying pitch can be employed to modulate surface temperatures during the disassembly heating processes described herein.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device, integrated circuit (IC) fabrication and photodetector fabrication may or may not be described in detail herein. By way of background, however, a more general description of the semiconductor device, IC or photodetector fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device, an IC or a photodetector according to the present invention utilize a variety of individually known physical and chemical processes performed on a semiconductor (e.g., silicon), glass or plastic substrate, some of which are described in the immediately following paragraphs.

In general, the various processes used to form semiconductor-based devices (e.g., a photodetector) fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A nanoscale selective functionalization method, comprising:
    self-assembling first molecules to nanowires of transistors provided on a wafer such that the first molecules coat the nanowires;
    identifying a transistor as a target transistor and transistors neighboring the target transistor as neighboring transistors;
    disassembling the first molecules from the nanowire of the target transistor without disassembling the first molecules from the nanowires of the neighboring transistors; and
    self-assembling second molecules to the nanowire of the target transistor such that the second molecules coat the nanowire of the target transistor,
    wherein:
    the disassembling comprises determining a disassembly temperature to which the target transistor is to be heated to disassemble the first molecules from the corresponding nanowire,
    the wafer has spacing between the target and the neighboring transistors and the spacing is sufficient to prevent a heating of the target transistor from heating the neighboring transistors to the disassembly temperature, and
    the nanoscale selective functionalization method further comprises:
    shielding at least one of the target transistors and the neighboring transistors during a heating of the target transistors to prevent an unwanted heating of the neighboring transistors; and
    reducing the spacing between the at least one of the target transistors with the shielding and the neighboring transistors,
    wherein the shielding comprises interposing FET-shaped shields consisting of tungsten (W) between the target transistors and the neighboring transistors.

2. The nanoscale selective functionalization method according to claim 1, wherein the transistors comprise field effect transistors (FETs).

3. The nanoscale selective functionalization method according to claim 2, wherein:
    the FETs each include a source, a drain and a nanowire extending between the source and the drain,
    the FETs are provided in a side-by-side nanoscale formation in which the sources and the drains are separated from neighboring sources and drains, respectively, by a distance that is substantially shorter than respective widths of the sources and the drains and in which the sources, the drains and the nanowires are aligned with each other, and
    the neighboring transistors consist of two neighboring transistors on either side of the target transistor.

4. The nanoscale selective functionalization method according to claim 1, wherein:
    the nanowires comprise silicon, and
    the self-assembling occurs in first and second solutions in which the first and second molecules, which bind to silicon, are dissolved, respectively.

5. The nanoscale selective functionalization method according to claim 1, wherein the disassembling comprises applying drain current to the target transistor.

6. The nanoscale selective functionalization method according to claim 1, wherein:
    each transistor comprises multiple nanowires extending between a source and a drain, and
    a pitch between the multiple nanowires in a single transistor is variable.

7. A nanoscale selective functionalization method, comprising:
- assembling a wafer comprising transistors, each transistor comprising a nanowire extending between a source and a drain;
- immersing the wafer in a first solution in which a first molecule, which binds to a material of the nanowires, is dissolved until self-assembly of the first molecule onto the nanowires is complete and the nanowires are coated with a first molecule coating;
- identifying a transistor as a target transistor and transistors neighboring the target transistor as neighboring transistors;
- heating the target transistor to disassemble the first molecule from the corresponding nanowire without disassembling the first molecule from the nanowires of the neighboring transistors; and
- re-immersing the wafer in a second solution in which a second molecule, which binds to a material of the nanowires, is dissolved until self-assembly of the second molecule onto the nanowire of the target transistor is complete and the nanowire of the target transistor is coated with a second molecule coating, wherein:
the nanoscale selective functionalization method further comprises determining a disassembly temperature to which the target transistor is to be heated to disassemble the first molecule from the corresponding nanowire,
the assembling of the wafer comprises providing spacing between the target and the neighboring transistors,
the spacing is sufficient to prevent the heating of the target transistor from heating the the neighboring transistors to the disassembly temperature, and
the nanoscale selective functionalization method further comprises:
shielding at least one of the target transistors and the neighboring transistors during a heating of the target transistors to prevent an unwanted heating of the neighboring transistors; and
reducing the spacing between the at least one of the target transistors with the shielding and the neighboring transistors,
wherein the shielding comprises interposing FET-shaped shields consisting of tungsten (W) between the target transistors and the neighboring transistors.

8. The nanoscale selective functionalization method according to claim 7, wherein the transistors comprise field effect transistors (FETs).

9. The nanoscale selective functionalization method according to claim 8, wherein:
the FETs each include a source, a drain and a nanowire extending between the source and the drain,
the FETs are provided in a side-by-side nanoscale formation in which the sources and the drains are separated from neighboring sources and drains, respectively, by a distance that is substantially shorter than respective widths of the sources and the drains and in which the sources, the drains and the nanowires are aligned with each other, and
the neighboring transistors consist of two neighboring transistors on either side of the target transistor.

10. The nanoscale selective functionalization method according to claim 7, wherein:
the nanowires comprise silicon, and
the first and the second solutions comprise water or alcohol solvents and the first and the second molecules comprise viruses or ions.

11. The nanoscale selective functionalization method according to claim 7, wherein the heating comprises applying drain current to the target transistor.

12. The nanoscale selective functionalization method according to claim 7, wherein:
each transistor comprises multiple nanowires extending between the source and the drain, and
the assembling comprises varying a pitch between the multiple nanowires in a single transistor.

* * * * *